US009035812B2

(12) United States Patent
Podsiadlik

(10) Patent No.: US 9,035,812 B2
(45) Date of Patent: May 19, 2015

(54) METHOD AND APPARATUS FOR GENERATING A BAND PASS SIGNAL

(71) Applicant: Tomasz Podsiadlik, Maynooth (IE)

(72) Inventor: Tomasz Podsiadlik, Maynooth (IE)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 13/966,745

(22) Filed: Aug. 14, 2013

(65) Prior Publication Data
US 2014/0077983 A1 Mar. 20, 2014

(30) Foreign Application Priority Data

Sep. 20, 2012 (EP) ..................................... 12360069

(51) Int. Cl.
H03M 3/00 (2006.01)
H03F 3/217 (2006.01)

(52) U.S. Cl.
CPC ............... H03M 3/30 (2013.01); H03F 3/2175 (2013.01)

(58) Field of Classification Search
CPC ..... H03M 3/30; H03M 7/304; H03M 7/3026; H03M 7/2018; H03F 3/2175; H04B 1/0053
USPC .......... 341/140–155; 375/295, 296, 298, 247, 375/245
See application file for complete search history.

(56) References Cited

U.S. PATENT DOCUMENTS

| 5,936,562 | A | * | 8/1999 | Brooks et al. | 341/143 |
| 5,977,896 | A | * | 11/1999 | Kohdaka et al. | 341/143 |
| 5,982,313 | A | * | 11/1999 | Brooks et al. | 341/143 |
| 7,003,358 | B2 | * | 2/2006 | Eastty et al. | 700/94 |
| 7,142,819 | B1 | * | 11/2006 | Kang et al. | 455/63.3 |
| 7,194,036 | B1 | * | 3/2007 | Melanson | 375/247 |
| 7,199,744 | B1 | * | 4/2007 | Melanson | 341/152 |
| 7,239,257 | B1 | * | 7/2007 | Alexander et al. | 341/138 |
| 7,391,842 | B1 | * | 6/2008 | Melanson | 375/376 |
| 7,860,474 | B1 | * | 12/2010 | Kang et al. | 455/296 |
| 8,284,858 | B2 | * | 10/2012 | Wurm et al. | 375/295 |
| 2010/0201444 | A1 | | 8/2010 | Malmqvist et al. | |

FOREIGN PATENT DOCUMENTS

| EP | 2 330 734 A1 | 6/2011 |
| EP | 2 398 148 A1 | 12/2011 |
| EP | 2 403 136 A1 | 1/2012 |

OTHER PUBLICATIONS

European Search Report for EP 12360069.4 dated Jan. 18, 2013.

* cited by examiner

Primary Examiner — Lam T Mai
(74) Attorney, Agent, or Firm — Fay Sharpe LLP

(57) ABSTRACT

A modulator and a method are disclosed. The modulator is for generating a band pass signal and comprises: sigma delta modulation logic operable to receive an input signal and to perform at least a 3-level quantisation of the input signal to generate an at least 3-level quantised signal; and requantisation logic operable to requantise the at least 3-level quantised signal to a 2-level quantised signal to be provided as the band pass signal. This approach improves the coding efficiency achieved compared to that possible using a 2-level sigma delta modulator, whilst also providing improved noise performance due to the inherent linearity of the 2-level quantised signal which is provided to drive the switch mode power amplifier. Accordingly, the performance of the modulator is improved by increasing its coding efficiency whilst maintaining its linearity which improves the noise performance in adjacent channels.

13 Claims, 8 Drawing Sheets

METHOD AND APPARATUS FOR GENERATING A BAND PASS SIGNAL

FIELD OF THE INVENTION

The present invention relates to a modulator and a method.

BACKGROUND

Modulators are known. For example, in a wireless telecommunications network, modulators may be utilised within an apparatus which drives an antenna which, in turn, transmits wireless telecommunications signals. In particular, the modulator may receive a broadband signal which is to be modulated prior to being supplied to an amplifier such as, for example, a switch mode power amplifier, in order to generate a suitable signal for transmission by the antenna.

Although existing modulators can provide adequate performance, they each have their own shortcomings.

Accordingly, it is desired to provide an improved modulator.

SUMMARY

According to a first aspect, there is provided a modulator for generating a band pass signal for a radio frequency switchmode power amplifier, the modulator comprising: sigma delta modulation logic operable to receive an input signal and to perform at least a 3-level quantisation of the input signal to generate an at least 3-level quantised signal; and requantisation logic operable to requantise the at least 3-level quantised signal to a 2-level quantised signal to be provided as the radio frequency signal.

The first aspect recognises that a problem with existing modulators is that their performance can lead to inefficiencies. In particular, the coding efficiency can be poor. The coding efficiency is poorest when a 2-level quantiser is used. It will be appreciated that generally, an 'n' level quantiser is one which takes, typically, a signal and quantises that signal to one of 'n' different discrete levels or amplitudes. For example, a 2-level quantiser is one that receives an input signal and provides an output signal at one of two different levels to approximate the input signal. Although the coding efficiency can be improved by increasing the number of quantiser levels, this increases the risk of non-linearity occurring due to the likelihood that there is unequal spacing between those quantisation levels.

The first aspect also recognises that unlike multiple level quantisers, the linearity of a 2-level sigma delta modulator is unaffected by offsetting one of the quantisation levels. In addition, the first aspect recognises that although the coding efficiency of conventional 2-level band pass sigma delta modulators can be increased by increasing the amplitude of a signal to be encoded, this approach does not offer a significant coding efficiency improvement and is usually a compromise between coding efficiency and the signal to noise ratio.

Accordingly, a modulator is provided. The modulator may generate a band pass signal for driving a radio frequency switchmode power amplifier. The modulator may comprise sigma delta modulation logic which receives an input signal and performs at least a 3-level quantisation of the input signal. That is to say, the sigma delta modulation logic quantises to at least three different discreet values to generate an at least 3-level quantised signal. Requantisation logic may be provided which requantises the at least 3-level quantised signal to become a 2-level quantised signal. The 2-level quantised signal may be provided as the band pass signal.

This approach improves the coding efficiency achieved compared to that possible using a 2-level sigma delta modulator, whilst also providing improved noise performance due to the inherent linearity of the 2-level quantised signal which is provided to drive, for example, a switch mode power amplifier. Accordingly, the performance of the modulator is improved by increasing its coding efficiency whilst maintaining its linearity which improves the noise performance in adjacent channels.

In one embodiment, the sigma delta modulation logic is operable to quantise the input signal to one of a lower level, at least one intermediate level and an upper level, and the requantisation logic is operable to requantise the at least 3-level quantised signal when at the at least one intermediate level to one of the lower level and the upper level. Accordingly, the intermediate levels which exist between the upper and lower quantisation levels may be requantised by the requantisation logic to the upper or the lower quantisation levels in order to restore linearity and provide a 2-level quantised signal. As mentioned above, this restores linearity and therefore improves the noise performance in adjacent channels.

In one embodiment, the requantisation modulation logic is operable to requantise the at least 3-level quantised signal when at the at least one intermediate level to the lower level to generate the 2-level quantised signal. By requantising the intermediate levels to the lower level, the probability that the output amplitude is in the high state is reduced which means that the modulator is therefore capable of encoding an input signal of the same power as a conventional level 2 modulator whilst producing less quantisation error power, which enhances the coding efficiency.

In one embodiment, the at least 3-level quantised signal comprises a 3-level quantised signal and the sigma delta modulation logic is operable to quantise the input signal to one of the lower level, an intermediate level and the upper level, and the requantisation logic is operable to requantise the at least 3-level quantised signal when at the intermediate level to one of the lower level and the upper level. Accordingly, when a signal having just three quantisation levels is provided, the signal when it is at the quantisation level between the upper and lower quantisation levels is requantised to either the upper level or the lower level.

In one embodiment, the requantisation modulation logic is operable to requantise the at least 3-level quantised signal when at the intermediate level to the lower level for a first period and to the upper level for a second period to generate the 2-level quantised signal. Accordingly, the requantisation modulation logic may requantise to the upper level for some of the time and then to the lower level for some other time. For example, the requantisation modulation logic may alternate between periods when it requantises to the upper level and periods when it requantises to the lower level.

In one embodiment, the requantisation modulation logic is operable to requantise the at least 3-level quantised signal when at the intermediate level to the lower level to generate the 2-level quantised signal.

In one embodiment, the requantisation is operable to apply a dc offset equivalent to a difference between one of the lower level and the intermediate level and the upper level and the intermediate level to generate the 2-level quantised signal. It will be appreciated that this improves the operation of the switch mode power amplifier.

In one embodiment, the sigma delta modulation logic comprises: a sigma delta modulator operable to quantise the input signal at a sampling frequency; and a carrier modulator operable to modulate the at least 3-level quantised signal with a carrier signal having a carrier frequency, the carrier frequency being an integer multiple of the sampling frequency. By causing the carrier frequency of the carrier modulated by the carrier modulator to be a integer multiple of the frequency at which the sigma delta modulator quantiles, the carrier frequency coincides with a zero of the Fourier transforms of the error pulses generated by the quantisation. As a result, the error present in the output signal corresponding with the non-linearity is supressed at the carrier frequency.

In one embodiment, the sigma delta modulation logic comprises a quadrature mixer comprising a parallel pair of sigma delta modulators and carrier modulators. Accordingly, a quadrature mixer may be provided which comprises a parallel pair of sigma delta modulators and carrier modulators, the phase of the carrier signal applied by one of the pair of carrier modulators being 90° out of phase with the other.

According to a second aspect, there is provided a method of generating a band pass signal, the method comprising: receiving an input signal and performing at least a 3-level quantisation of the input signal to generate an at least 3-level quantised signal; and requantising the at least 3-level quantised signal to a 2-level quantised signal to be provided as the band pass signal.

In one embodiment, the step of performing comprises quantising the input signal to one of a lower level, at least one intermediate level and an upper level, and the step of requantising comprises requantising the at least 3-level quantised signal when at the at least one intermediate level to one of the lower level and the upper level.

In one embodiment, the step of requantising comprises requantising the at least 3-level quantised signal when at the at least one intermediate level to the lower level to generate the 2-level quantised signal.

In one embodiment, the at least 3-level quantised signal comprises a 3-level quantised signal and the step of quantising comprises quantising the input signal to one of the lower level, an intermediate level and the upper level, and the step of requantising comprises requantising the at least 3-level quantised signal when at the intermediate level to one of the lower level and the upper level.

In one embodiment, the step of requantising comprises requantising the at least 3-level quantised signal when at the intermediate level to the lower level for a first period and to the upper level for a second period to generate the 2-level quantised signal.

In one embodiment, step of requantising comprises requantising the at least 3-level quantised signal when at the intermediate level to the lower level to generate the 2-level quantised signal.

In one embodiment, step of requantising comprises applying a dc offset equivalent to a difference between the lower level and the intermediate level to generate the 2-level quantised signal.

In one embodiment, the step of performing comprises quantising the input signal at a sampling frequency; and the method comprises modulating the at least 3-level quantised signal with a carrier signal having a carrier frequency, the carrier frequency being an integer multiple of the sampling frequency.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

BRIEF DESCRIPTION OF THE DRAWINGS

Embodiments of the present invention will now be described further, with reference to the accompanying drawings, in which:

FIG. 10(A) shows the time domain waveforms—dashed line-conventional, continuous line—the modulator of FIG. 7;

FIG. 10(B) shows measured output spectra;

DESCRIPTION OF THE EMBODIMENTS

Overview

Figure 1:
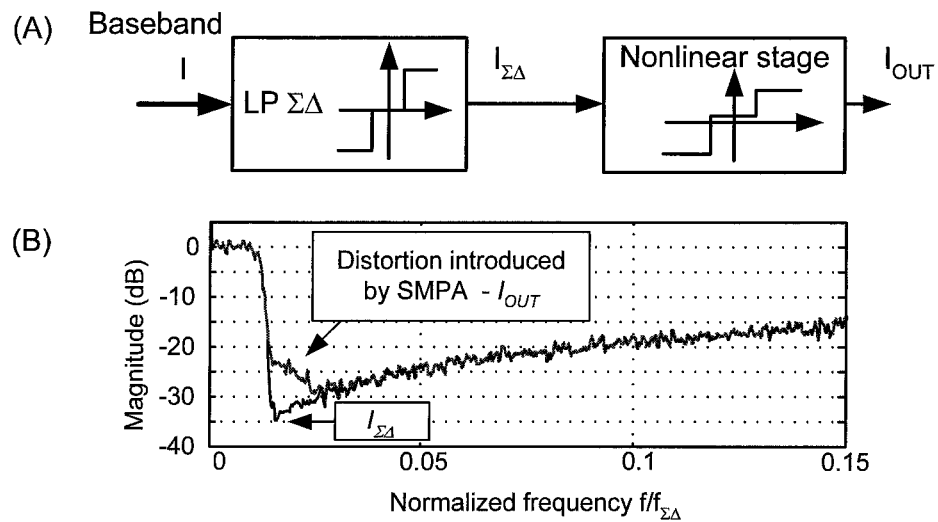
FIG. 1(A) illustrates a sigma-delta modulator driving a nonlinear 3-level switchmode power amplifier.
FIG. 1(B) illustrates the output spectrum of the nonlinear amplifier of FIG. 1(A)

Before discussing the embodiments in any more detail, first an overview will be provided. As mentioned above, existing 2-level sigma delta modulators used to generate radio frequency (or band pass) signals to drive, for example, a switchmode power amplifier for the production of suitable power radio frequency (or band pass) signals to be supplied to an antenna can suffer from poor encoding efficiency. Multilevel sigma delta modulators are characterised by better coding efficiency, but the risk of nonlinearity occurs (as only 2-level modulators can be inherently linear). Accordingly, a modulator such as, for example, a sigma delta delta modulator is provided which improves the coding efficiency whilst also achieving high linearity (which reduces inter-channel noise). The high coding efficiency is achieved by performing quantisation by the sigma delta modulator using three or more quantisation levels. Typically, three quantisation levels may be sufficient to achieve a reasonable improvement in coding efficiency in comparison with two levels of quantisation. Any non-linearities introduced by the quantisation by the 3-level sigma sigma deltamodulator (typically due to changes between the quantisation levels) are obviated by subsequently requantising that quantised signal to a 2-level quantised signal. Also, the effect of any error signals generated as a result of the requantisation of the sigma sigma deltamodulator is obviated by arranging for the carrier frequency sigma delta to be an integer multiple of the sampling frequency of the sigma delta modulator. As will be described in more detail below, this helps to provide a modulator with an increased coding efficiency whilst also minimising inter-channel noise.

Sigma Delta ($\Sigma\Delta$) Modulation

An error addition is inherent to a quantisation process present in sigma delta modulation. The amount of error contents depends upon the quantiser level spacings. Quantisation error power is largest when a 2-level quantiser is used. A coding efficiency parameter ($\eta_{coding}$) is used to describe sigma delta modulation in terms of useful signal and quantisation noise power in its output: $\eta_{coding}$=(useful power encoded by $\Sigma\Delta$ modulator)/(total power in the output signal from $\Sigma\Delta$ modulator).

Coding efficiency can be improved by increasing the number of quantiser levels, but this increases the risk of nonlinearity due to unequal spacing of levels. In contrast with multilevel quantisation, a 2-level sigma delta modulator's linearity is unaffected by offsetting one of the levels.

Embodiments seek to improve upon the low coding efficiency achieved by 2-level sigma delta modulation. The resulting 2-level signal is characterized by improved coding efficiency and improved noise performance in adjacent channels in comparison with conventional 2-level band pass sigma delta modulator. Previous solutions use conventional 2-level band pass sigma delta modulators, whose coding efficiency is enhanced by increasing the amplitude of a signal being encoded. Such an approach does not offer significant coding efficiency improvements and usually is a compromise between coding efficiency and signal-to-noise ratio.

Switch-mode Power Amplifier

Embodiments provide a modified modulator for driving radio frequency switch-mode power amplifiers in wireless systems. A class-S power amplifier consists of three major blocks, a sigma-delta ($\Sigma\Delta$) modulator that encodes the input radio-frequency (RF) signal into a pulse stream, a switch-mode (class-D) amplifier and a band pass filter. The encoded into pulse stream band pass signal drives the transistors in the switch-mode power amplifier into on and off regions, offering potentially 100% power efficiency. The drive signal can be 2, 3 or more levels. The major reason for the use of a multilevel quantiser in a sigma-delta modulator is that the mean square value of the quantisation error is proportional to the quantiser level spacing; the more levels, the less noise is generated. It was also observed that a 3-level, sigma-delta driven class-D amplifier can have better drain efficiency than the equivalent switch-mode power amplifier driven by 2-level sigma-delta modulator.

The design of a multilevel switch-mode power amplifier operating at giga-hertz speeds imposes serious implementation challenges concerning linearity. The linearity of 2-level sigma-delta modulator is not affected when one of the quantiser levels shifts, and therefore is often preferred over a multilevel switch-mode power amplifier.

As mentioned above, embodiments allow for conversion of a 3-level sigma-delta modulator's output signal to a 2-level signal. The resulting 2-level signal provides improved coding efficiency compared with conventional 2-level band pass sigma-delta modulator. Such a 2-level signal can be deployed to drive a radio frequency switchmode power amplifier. The advantage in reduced noise content is gained while preserving low complexity of the 2-level operation.

Nonlinearity of 3-Level Modulator

A 3-level sigma-delta modulator offers a 6 dB reduction in noise when compared with a 2-level sigma-delta modulator. This improvement can however be achieved only when ideal components are used to implement the 3-level modulator. When the stage that follows the 3-level modulator induces unequal spacings between the levels, this causes a nonlinearity and thus degrades signal to noise ratio (SNR). In contrast, the linearity of 2-level sigma-delta modulator will not become worse when one of the levels shifts.

Consider a 3-level, low-pass sigma-delta modulator (LP$\Sigma\Delta$) followed by a nonlinear stage, e.g. a 3-level switchmode power amplifier shown in FIG. 1a, whose input is supplied with a baseband signal I. The nonlinearity of the switchmode power amplifier results in a distorted frequency response as shown in FIG. 1b. This nonlinearity effect on the signal-to-noise ratio in the 3-level modulator's output can be significantly reduced in a band pass sigma-delta (BP$\Sigma\Delta$) modulator's output.

Error Pulse Shaping in the Output from 2-Level Sigma Delta Modulator

One existing modulation scheme for a digital radio frequency transmitter utilizes a pair of low-pass sigma-delta modulators. Each of the modulators encodes the baseband signal I or Q. The low-pass sigma-delta modulator outputs are consequently mixed with a carrier signal and added. The resulting output consists of quantisation noise and a transmitted signal at a carrier frequency $f_C$.

It is observed that in some cases such pair of 3-level low-pass sigma-delta modulators coupled with a quadrature mixer can be followed by nonlinear stage, and the nonlinearity effect will be suppressed in the band of interest.

Figure 2:
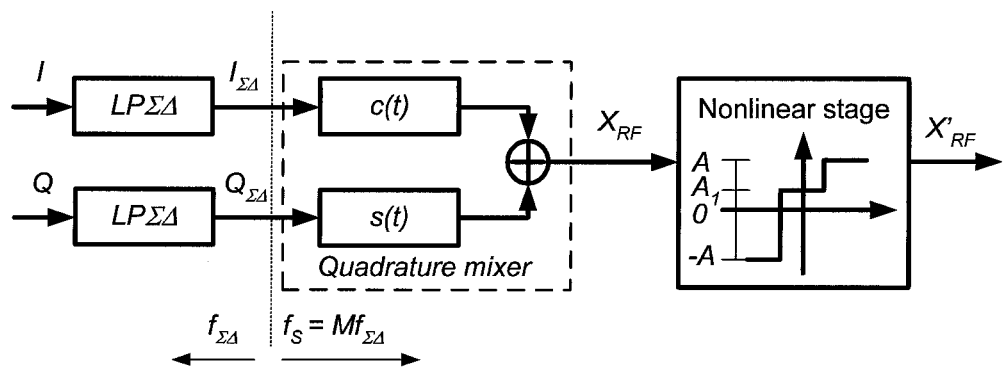
FIG. 2 illustrates a pair of 3-level, low pass sigma-delta modulators coupled with a quadrature mixer and followed by nonlinear stage.
Figure 3:
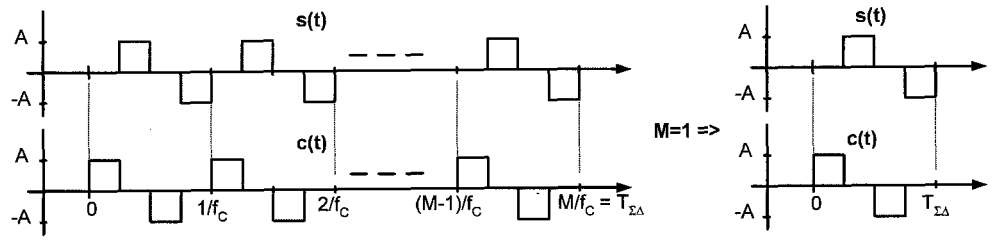
FIG. 3 illustrates the impulse responses of quadrature mixer blocks c(t), s(t) of FIG. 2—the right hand side waveforms show the example for M=1.

FIG. 2 shows a quadrature mixer scheme followed by nonlinear stage. The nonlinearity of the following stage is represented by offsetting its zero level by $A_1$ as it is indicated. In order to produce output signal $X_{RF}$ whose spectrum is shifted at a carrier frequency $f_C$, c(t) and s(t) blocks in the quadrature mixer are characterized by impulse responses having the same fundamental frequency $f_C$ and 90° phase difference. The impulse responses c(t) and s(t) are depicted in FIG. 3.

The parameter M relates sampling rate of the low-pass sigma-delta modulators $f_{\Sigma\Delta}$ to carrier frequency $f_C$ and will be described below. At every clock cycle denoted as $T_{\Sigma\Delta}$ ($T_{\Sigma\Delta}$=1/$f_{\Sigma\Delta}$), the output $X_{RF}$ from the quadrature mixer becomes a sum of impulse responses c(t) and s(t) multiplied by outputs from the low-pass sigma-delta modulators. The 3-level low-pass sigma-delta modulator output can take one of the three values: −1, 0, +1.

The output from the nonlinear stage $X_{RF}'$ is created by offsetting every zero-valued output $X_{RF}$ by $A_1$. Subsequently, the output from a nonlinear stage can be expressed as a sum of the output $X_{RF}$ and an error pulse $g_e(t)$ or $h_e(t)$.

Figure 4:
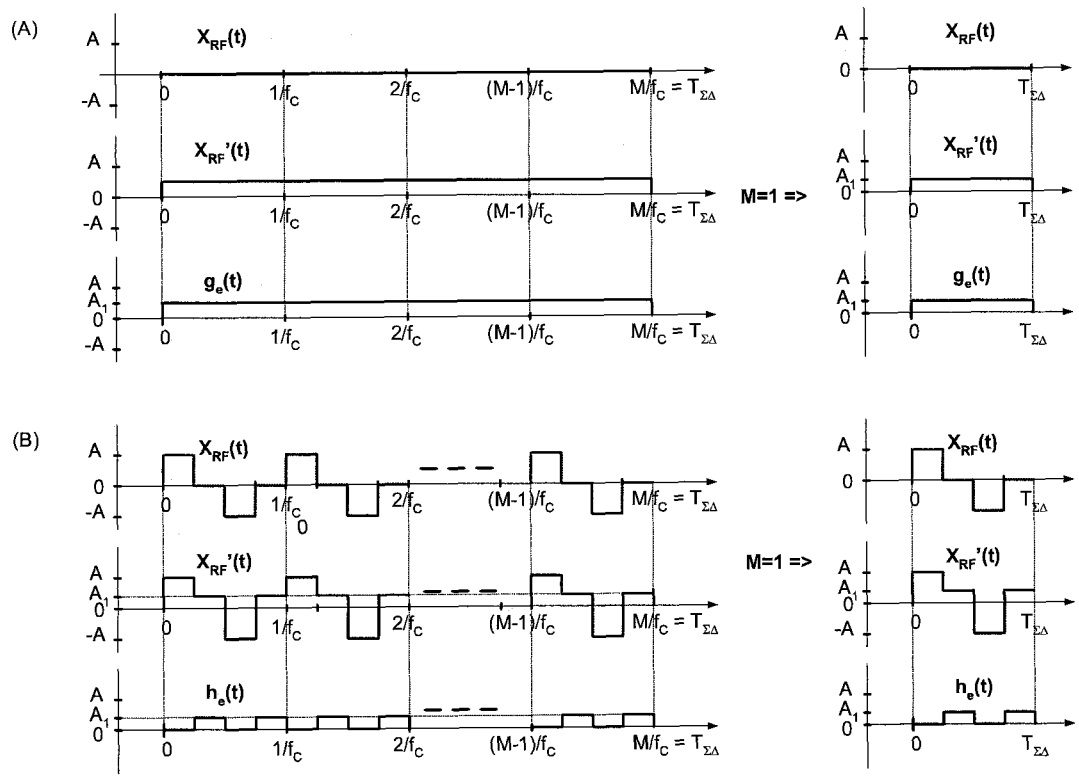
FIG. 4 shows the modulator of FIG. 2's output waveforms for (A) $I_{\Sigma\Delta}=0$, $Q_{\Sigma\Delta}=0$ (B) $I_{\Sigma\Delta}=1$, $Q_{\Sigma\Delta}=0$—the right hand side waveforms show the example for M=1.

Two types of error pulse are distinguished when the $I_{\Sigma\Delta}$ and $Q_{\Sigma\Delta}$ outputs are 3-level signals. When both are zero, $I_{\Sigma\Delta}=Q_{\Sigma\Delta}=0$, yielding an error pulse $g_e(t)$, depicted in FIG. 4(A). When only one is zero, $I_{\Sigma\Delta}\neq 0$ and $Q_{\Sigma\Delta}=0$ or $I_{\Sigma\Delta}=0$ and $Q_{\Sigma\Delta}\neq 0$, yielding an error pulse denoted by $h_e(t)$. Example of $h_e(t)$ for $I_{\Sigma\Delta}=1$ and $Q_{\Sigma\Delta}=0$ shown in FIG. 4(B)

When a fundamental frequency of a quadrature mixer is chosen such that $f_C=Mf_{\Sigma\Delta}$, with M being a positive integer number and $f_{\Sigma\Delta}$ denoting sampling rate of $\Sigma\Delta$ modulators, then the carrier frequency coincides with a zero of $G_e(f)$ and $H_e(f)$. $G_e(f)$ and $H_e(f)$ are Fourier transforms of error pulses $g_e(t)$ and $h_e(t)$. The error present in the output signal $X'_{RF}(f)$ corresponding with the nonlinearity is therefore suppressed at carrier frequency $f_C$ by the mentioned zero of either Ge(f) or He(f). Spectral separation between the signal of interest and the nonlinear-quantiser's error is therefore provided.

Figure 5:
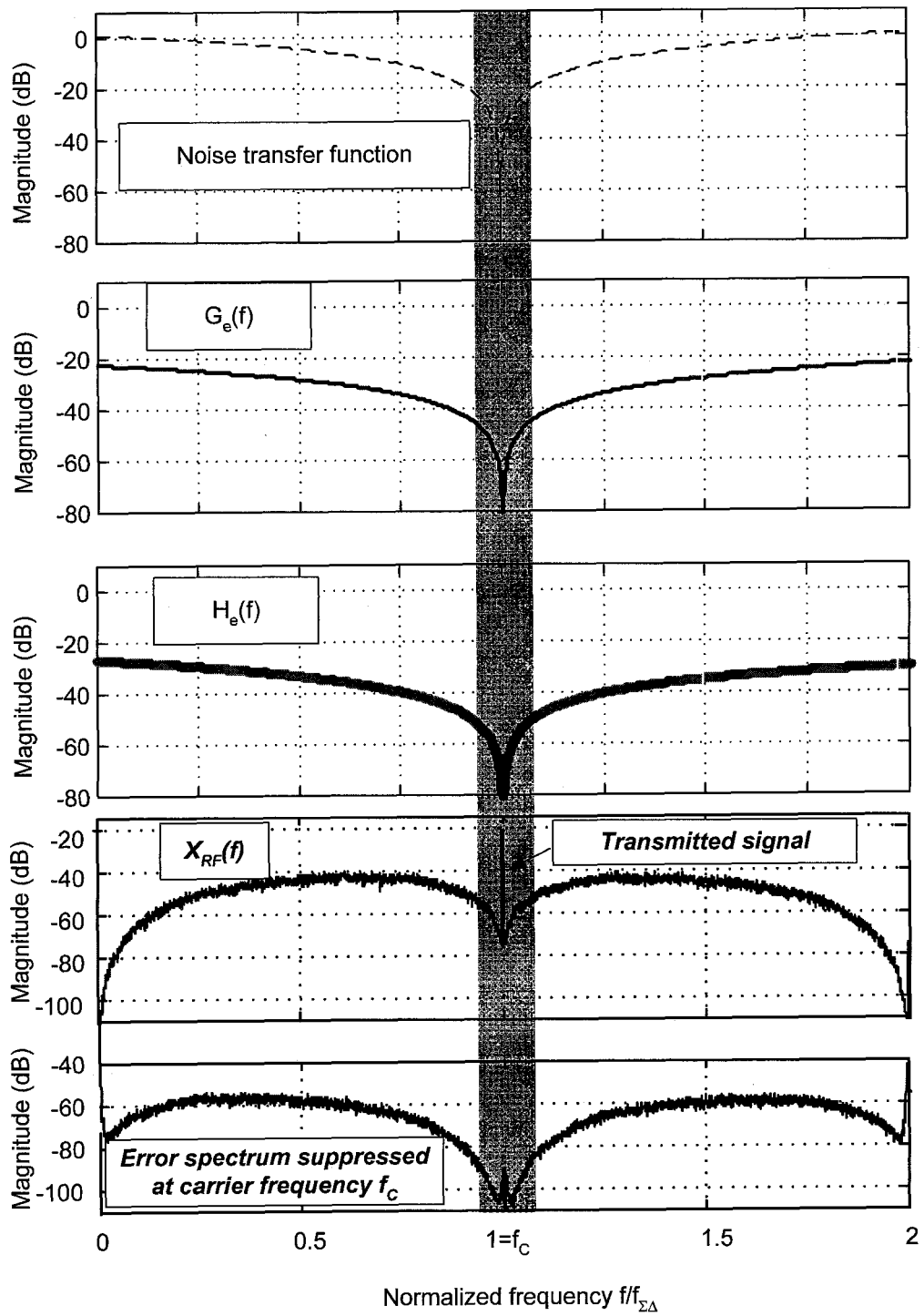
FIG. 5 shows noise shaping functions, modulator's output spectrum, spectrum of the error induced by nonlinear stage for M=1.

FIG. 5 shows a noise transfer function of sigma-delta modulators and $G_e(f)$, $H_e(f)$ for M=1. The signal band is marked by the shaded area centred at a normalized frequency $f/f_{\Sigma\Delta}=1$. Note that all noise transfer functions, $G_e(f)$ and $H_e(f)$, have a zero in the centre of the signal band. The spectrum of the 3-level output $X_{RF}$ is shown. The error spectrum addition in signal $X_{RF}'(f)$ simulated for the offset $A_1=0.2$ in the nonlinear stage is shown at the bottom of FIG. 5.

It can be seen that the error's magnitude is suppressed by 15 dB below the magnitude of the quantisation noise introduced by the 3-level sigma delta modulator in the signal band. The error suppression at frequency $f_C$ is desired and it prevents signal to noise ratio degradation in the output from the nonlinear 3-level stage.

Modulator Embodiment

The property of spectral shaping of the error induced by the nonlinear 3-level quantiser mentioned above can be exploited to transform a 3-level signal into a 2-level pulse stream. A conventional and a 2-level modulator according to one embodiment are shown in FIG. 6 and FIG. 7, respectively.

Figure 6:
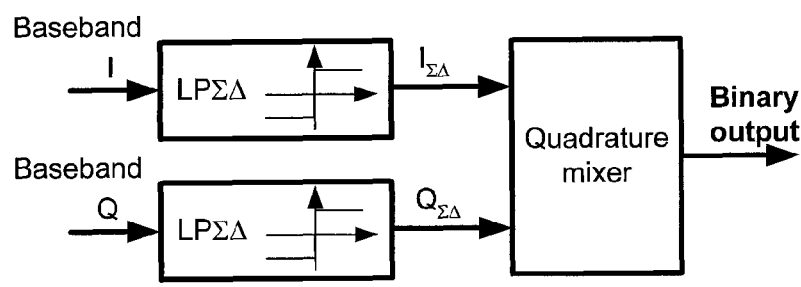
FIG. 6 illustrates a conventional 2 level modulator.
Figure 7:
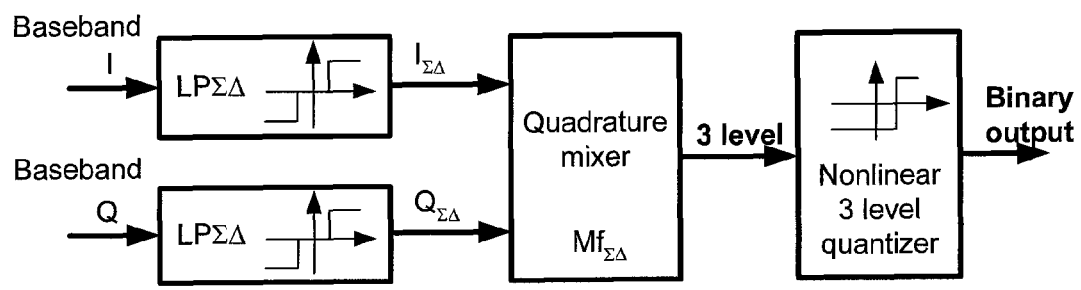
FIG. 7 illustrates a modulator according to one embodiment.

The modulator structure of FIG. 7 is created by replacing the pair of 2-level sigma-delta modulators in the conventional 2-level modulator of FIG. 6 with a pair of 3-level sigma-delta modulators. Also, the quadrature mixer is followed by a nonlinear 3-level quantiser whose middle level is offset by $A_1=-A$ (A1=+A is also possible), forcing it to the same value as the lower level (or the upper level).

Figure 8:
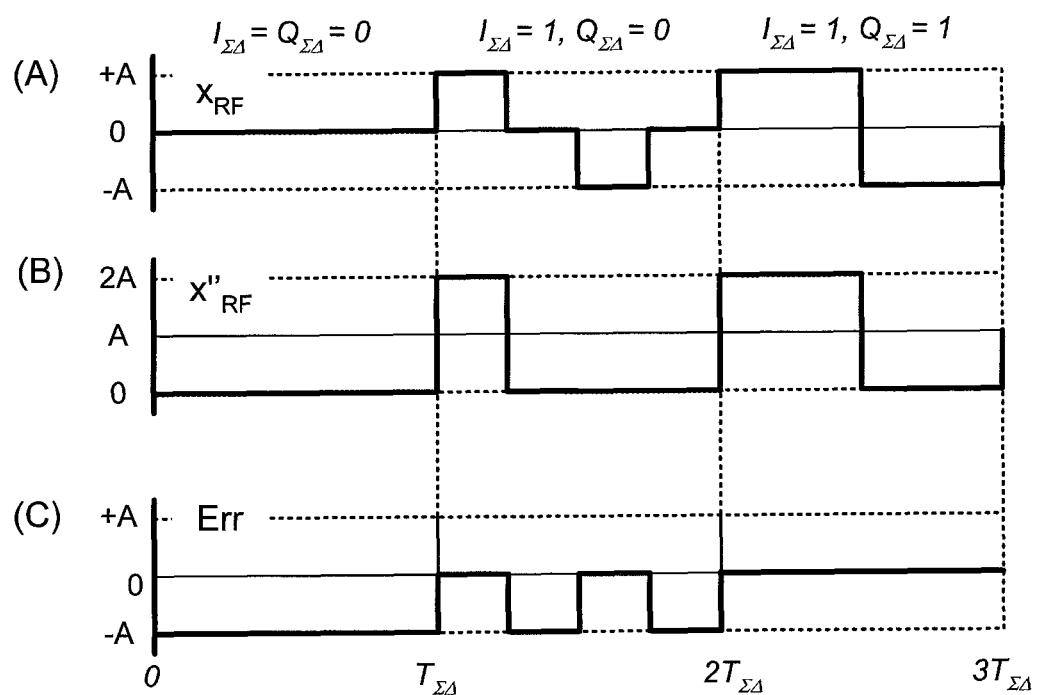
FIG. 8 shows output waveforms of the modulator of FIG. 7 for M=1, A1=−A.

An example of waveforms for M=1 is shown in FIG. 8. Thus the 3-level signal $X_{RF}(t)$ of FIG. 8(A) transforms or requantises to a 2-level pulse stream. Adding a dc offset of A to this signal yields the signal $X_{RF}''$ as shown in FIG. 8(B). The error waveform created is shown in FIG. 8(C).

Figure 13:
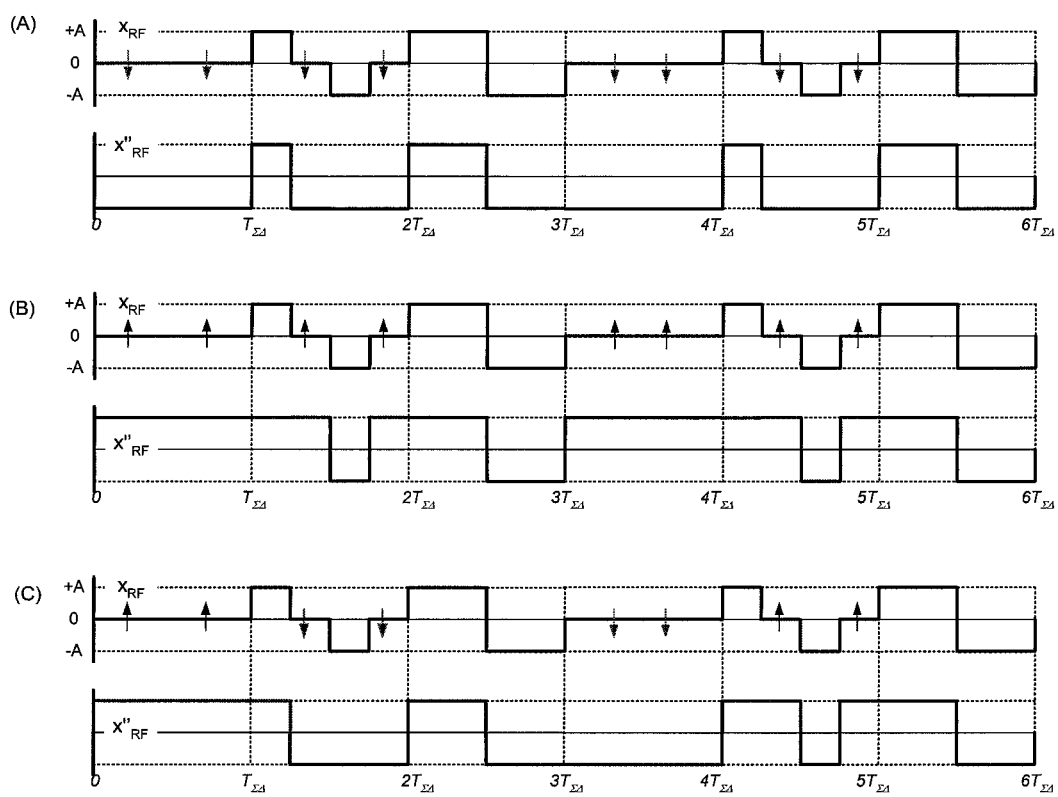
FIG. 13 shows alternative output waveforms of the modulator of FIG. 7.

FIG. 13 illustrates different approaches for performing the offsetting or requantising of the middle or intermediate level. In FIG. 13(A), the intermediate level is requantised to the lower level in a similar manner to that described above. In FIG. 13(B), the intermediate level is requantised to the upper level. In FIG. 13(C), the intermediate level is requantised, in alternate time periods or clock cycles $T_{\Sigma\Delta}$, to either the upper or the lower level.

Hence, it can be seen that regardless of a dc offset in the output from the modulator, during every clock cycle ($T_{\Sigma\Delta}$), all middle or intermediate (zero) levels can be offset by +A, or -A, or either. The 'direction' of offsetting the middle level may be random. The condition necessary to provide the requantisation-suppression at the carrier frequency is that the offsetting direction must not change within the duration of the pulse $T_{\Sigma\Delta}$. All following simulated and experimental results assume fixed direction of offsetting $A_1=-1$ for obtaining best SNR, ACLR and coding efficiency performance.

The spectral separation of the transmitted signal at frequency $f_C$ to the error generated by the requantisation from 3-levels to 2-levels is provided by ensuring that a positive integer M value is used in the quadrature mixer as described above. This shapes the error pulses $g_e(t)$ and $h_e(t)$ as it was depicted in FIG. 4.

Although the error pulses have increased amplitudes to -A, their Fourier transforms $G_e(f)$, $H_e(f)$ maintain zeros at a carrier frequency $f_C$ as depicted in FIG. 5.

The resulting 2-level output of the modulator of FIG. 7 has an out of band noise power level close to a noise power level of 3-level modulator slightly degraded by the requantisation from 3-levels to 2-levels.

Coding Efficiency

The probability of a conventional 2-level modulator's amplitude being in a high state (+2 A) is 0.5 for zero mean input (e.g. 4QAM) signal. This means that the output of a conventional 2-level modulator remains in a 'high' state for half of the operation time. In contrast, the probability of the output amplitude of the 2-level modulator of FIG. 7 being in high state depends on the mean absolute value of the input signal. In testing the probability was determined to be less than 0.5 for all tested signals. The 2-level modulator of FIG. 7 is therefore capable of encoding an input signal of the same power level as the conventional 2-level modulator, while producing less quantisation error power. The coding efficiency improvement of the 2-level modulator of FIG. 7 is therefore expected.

The coding efficiencies of 3-level, and 2-level modulators—conventional and proposed—were simulated as functions of a peak to average power ratio of an input, band limited signal. The results are shown in FIG. 9(A).

While the coding efficiency of the conventional 2-level system decreases towards zero with an increase of the peak to average power ratio of the input signal, the 2-level pulse stream of the modulator of FIG. 7 maintains a coding efficiency of approximately 8%, even for large peak to average power ratio values. The improvement of the 2-level system of FIG. 7 against the conventional 2-level modulator of FIG. 6 is observed. The coding efficiency is not dependent on the M parameter. Indeed it would appear that the coding efficiency of the modulator of FIG. 7 is the best among other, 2-level band pass sigma-delta modulators.

Signal to Noise Ratio and Adjacent Channel Leakage Ratio

The input signal used for adjacent channel leakage ratio (ACLR) and SNR simulations was 4QAM with peak to average power ratio of PAPR=8 dB. A first order noise transfer function (NTF=$1-z^{-1}$) was used. It is practical to compare the 2-level modulator of FIG. 7 against its ideal prototype (being an ideal, 3-level modulator of FIG. 7 without a nonlinear quantiser), and a conventional 2-level sigma-delta modulator (as being competed against).

For M=1, the modified 2-level modulator's ACLR performance was worse than that of the 3-level system, by approximately 0.8 dB, and it showed 2 dB of improvement in comparison to the conventional 2-level modulator.

FIG. 9(B) shows a signal to noise ratio (SNR) of 2-level systems below the SNR of the 3-level modulator, e.g. 0 dB indicates that a 2-level system provides the same SNR as the 3-level one, while -1 dB means 1 dB SNR degradation compared with the 3-level modulator. The oversampling ratio (OSR) of 80 indicates that the calculation is carried out only inside the signal band, while for lower values of OSR also an out of band noise power is included in the calculations. The OSR relation to SNR calculation band is depicted in FIG. 9(C).

It is observed that when M=1, the 2-level modulator of FIG. 7 exhibits a SNR nearly as good as the SNR of a 3-level modulator at low OSR values. The SNR degrades with an increase of OSR, performing worse than a conventional 2-level modulator when the OSR increases above 35. This implies that for M=1, the 2-level modulator of FIG. 7 generates more of an in band error power than the conventional 2-level one. In contrast, the signal to noise ratio improvement in the output of the modified modulator is observed when M=4. The signal to noise ratio performance in this case is better than that of the conventional 2-level modulator over the entire displayed range of oversampling ratio.

The use of higher M can be however impractical in some cases. The parameter M relates carrier frequency to sigma-delta sampling rate by $f_C = Mf_{\Sigma\Delta}$.

In other words the increase of the parameter M improves requantisation-error suppression in a signal band, but it also limits the maximum sampling rate of the sigma-delta modulator, e.g.

$M=1 \Rightarrow f_{\Sigma\Delta} = f_C$, $M=2 \Rightarrow f_{\Sigma\Delta} = f_C/2$, $M=3 \Rightarrow f_{\Sigma\Delta} = f_C/3$ etc.

Since it is known that the reduction of the sigma-delta sampling rate causes degradation of SNR, the modulator's performance for parameter M=1 is of the highest interest.

Figure 11:
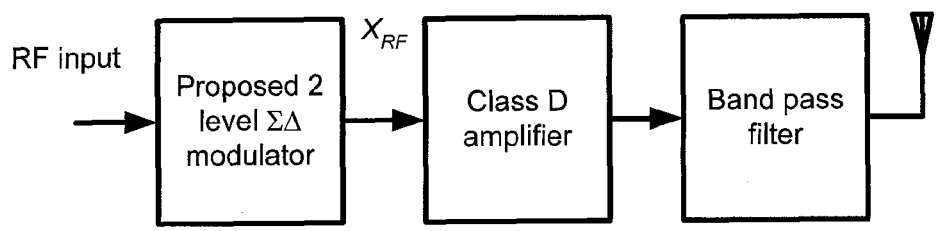
FIG. 11 illustrates a class—S power amplifier.

The last functional block in a class S power amplifier is a band pass filter as illustrated in FIG. 11. The role of the filter is to remove quantisation noise induced by the sigma-delta modulator from the output spectrum. Because the real filter has always some transition band before it can provide sufficient attenuation, the quantisation noise in adjacent channels is transmitted along with the signal of interest in a class S power amplifier. This affects the transmitted signal's quality. For this reason, the overall noise content in a signal band and in adjacent channels should be kept low. It is observed in FIG. 9(B) that the 2-level modulator of FIG. 7 with M=1 adds more noise within a signal band (OSR=80) than a conventional 2-level modulator, but its performance is better when the adjacent channels are included in SNR calculations (OSR=16).

Experimental Results

The conventional 2-level system of FIG. 6 and the 2-level modulator of FIG. 7 have been implemented using a Virtex (TM) II Pro FPGA board. Each sigma-delta modulator was provided with 0.625 MHz wide baseband I, Q input signals, creating a 4QAM signal with a peak to average power ratio of 8 dB. The same input signal was used for measuring the output spectra of the conventional 2-level and the FIG. 7 modulators. Both sigma-delta modulators were first order modulators with the same noise transfer functions and sampled at the rate of $f_{\Sigma\Delta}$=100 MHz. For M=1 the corresponding carrier signal was $f_C$=100 MHz, resulting in the output pulse stream bit rate of 400 MHz.

It is observed from the measured time domain waveforms shown in FIG. 10(A), that the total duration of high state output is shorter in the modulator shown in FIG. 7, which indicates that the pulse train produced by the 2-level modulator of FIG. 7 has lower power than the output of the conventional modulator, while delivering the same power of the signal of interest.

The output spectra for a conventional 2-level of FIG. 6 and the FIG. 7 2-level modulators are shown in FIG. 10(B). The 2-level modulator of FIG. 7 exhibits less quantisation noise in proximity to transmitted signal band at frequency $f_C$=100 MHz. Coding efficiencies for the measured signals are: conventional $\eta_{coding}$=8.9%, modified modulator of FIG. 7 $\eta_{coding}$=21%.

Figure 12:
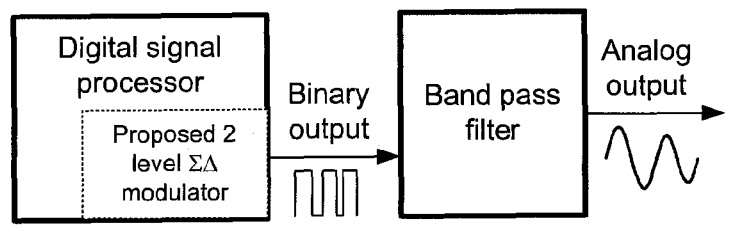
FIG. 12 illustrates a digital to analogue converter.

Hence, it can be seen that the modulator of FIG. 7 can be used to drive a radio frequency, 2-level class D power amplifier designated for wireless communication. The scheme of a class S power amplifier is shown in FIG. 11. The replacement of a conventional 2-level band pass sigma-delta modulator by the improved coding efficiency modulator of FIG. 7 may result in better power efficiency and relaxed band pass filter requirements. The modulator can be used when the generation of a band-pass signal. A binary serial link from a digital signal processor coupled with a band pass filter provides an enhanced, sigma-delta based digital to analogue converter as depicted in FIG. 12.

Embodiments provide an enhanced method for generating a noise shaped 2-level output signal. The improvement is done at a minor hardware cost increase in comparison with conventional band pass sigma delta modulator.

Figure 9:
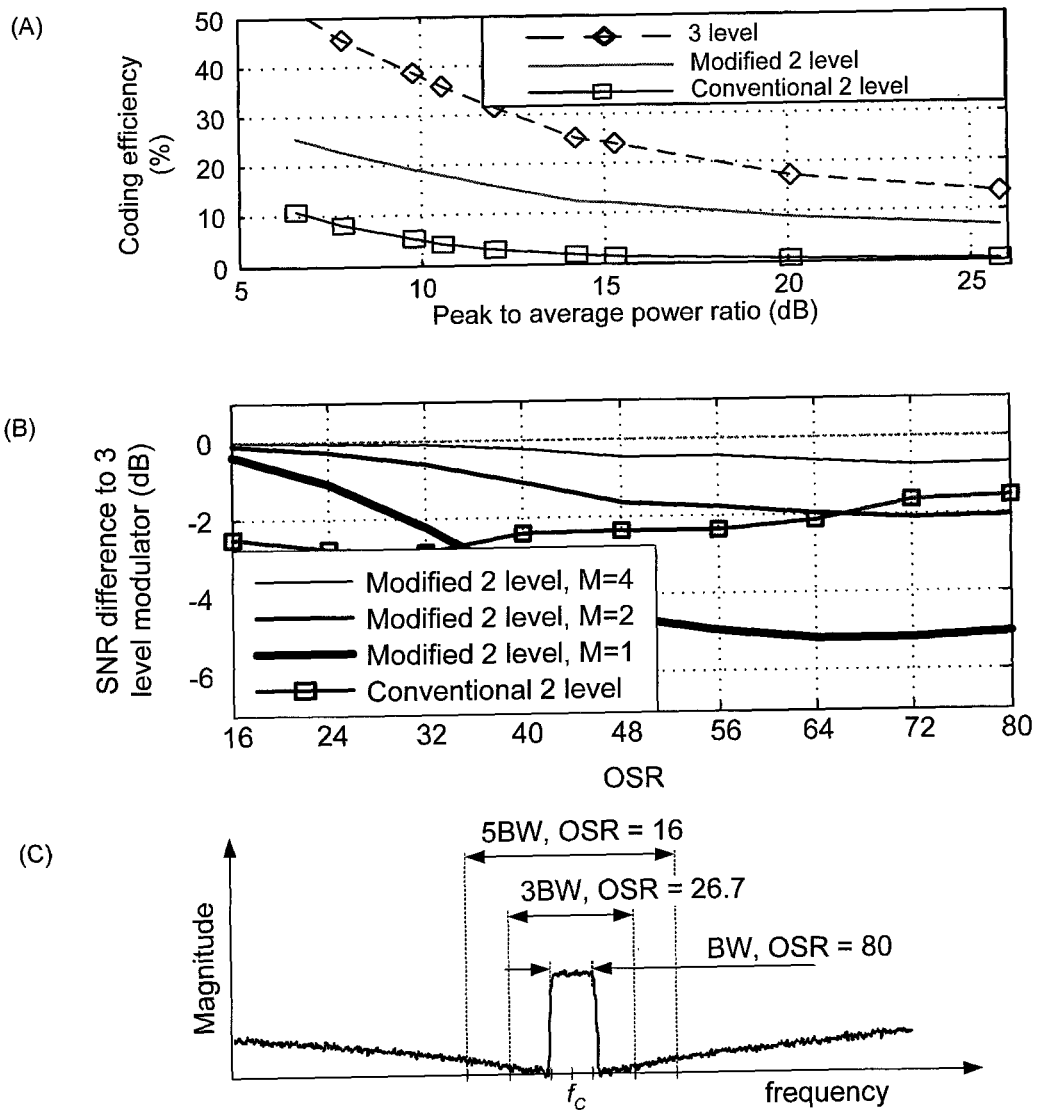
FIG. 9(A) shows the simulated coding efficiency for M=1, the sigma delta modulators used are of first order.
FIG. 9(B) shows the simulated signal to noise ratios.
FIG. 9(C) shows the OSR related to the SNR calculation band—the OSR=80 corresponds to the signal band BW only in the cases simulated.
Figure 10:
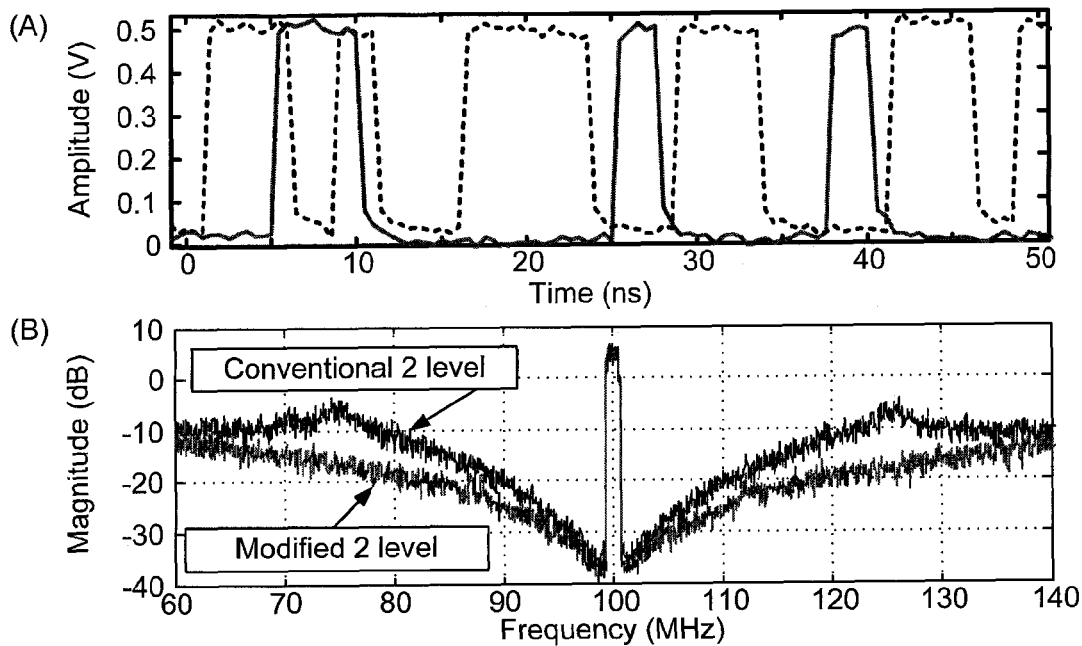
FIG. 10 shows the measured outputs from the conventional modulator of FIG. 6 and the modulator of FIG. 7.

Embodiments provide a modification of a band pass sigma delta modulator. The modification allows for improving coding efficiency. The comparison of the modulator of FIG. 7 and conventional 2-level modulators for coding efficiency is shown in FIG. 9. The output spectrum from the modulator of FIG. 7 is also characterized by a lower level of quantisation error power in proximity of the band of interest as shown in FIG. 10.

In embodiments, the error pulses do not need to be aligned with nT$\Sigma\Delta$ time; they can begin later (or earlier) and end later (or earlier).

In embodiments, the modulator may be implemented without the use of digital signal processors. For example, the modulator may be implemented with a continuous time sigma-delta modulator, requantiser and mixer.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices maybe, e.g., digital memories, magnetic storage media such as a magnetic disks and magnetic tapes, hard drives, or optically readable digital data storage media. The embodiments are also intended to cover computers programmed to perform said steps of the above-described methods.

The functions of the various elements shown in the Figures, including any functional blocks labelled as "processors" or "logic", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" or "logic" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. 3o Other hardware, conventional and/or custom, may also be included. Similarly, any switches shown in the Figures are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The invention claimed is:

1. A modulator for generating a band pass signal, said modulator comprising:
sigma delta modulation logic operable to receive an input signal and to perform at least a 3-level quantisation of said input signal to generate an at least 3-level quantized signal; and
requantisation logic operable to requantise said at least 3-level quantized signal to a 2-level quantized signal to be provided as said band pass signal, said requantisation modulation logic being operable to requantise said at least 3-level quantized signal when at said at least one intermediate level to said lower level to generate said 2-level quantised signal.

2. The modulator of claim 1, wherein said requantisation modulation logic being operable to quantise said at least 3-level quantised signal when at said intermediate level to said lower level to generate said 2-level quantised signal.

3. The modulator of claim 1, wherein said sigma delta modulation logic comprises a quadrature mixer comprising a parallel pair of sigma delta modulators and carrier modulators.

4. A modulator for generating a band pass signal, said modulator comprising:
sigma delta modulation logic operable to receive an input signal and to perform at least a 3-level quantisation of said input signal to generate an at least 3-level quantized signal, said sigma delta modulation logic being operable to quantise said input signal to one of a lower level, at least one intermediate level and an upper level, and said requantisation logic being operable to requantise said at least 3-level quantised signal when at said at least one intermediate level to one of said lower level and said upper level; and
requantisation logic operable to requantise said at least 3-level quantized signal to a 2-level quantized signal to be provided as said band pass signal.

5. A modulator for generating a band pass signal, said modulator comprising:
sigma delta modulation logic operable to receive an input signal and to perform at least a 3-level guantisation of said input signal to generate an at least 3-level quantized signal, said at least 3-level quantised signal comprises a 3-level quantised signal and said sigma delta modulation logic being operable to quantise said input signal to one of said lower level, an intermediate level and said upper level, and said requantisation logic being operable to requantise said at least 3-level quantised signal when at said intermediate level to one of said lower level and said upper level; and
requantisation logic operable to requantise said at least 3-level quantized signal to a 2-level quantized signal to be provided as said band pass signal.

6. A modulator for generating a band pass signal, said modulator comprising:
sigma delta modulation logic operable to receive an input signal and to perform at least a 3-level quantisation of said input signal to generate an at least 3-level quantized signal; and
requantisation logic operable to requantise said at least 3-level quantized signal to a 2-level quantized signal to be provided as said band pass signal, said requantisation being operable to apply a dc offset equivalent to a difference between one of said lower level and said intermediate level and said upper level and said intermediate level to generate said 2-level quantised signal.

7. A modulator for generating a band pass signal, said modulator comprising:
sigma delta modulation logic operable to receive an input signal and to perform at least a 3-level quantisation of said input signal to generate an at least 3-level quantized signal, said sigma delta modulation logic comprising:
a sigma delta modulator operable to quantise said input signal at a sampling frequency; and
a carrier modulator operable to modulate said at least 3-level quantised signal with a carrier signal having a carrier frequency, said carrier frequency being an integer multiple of said sampling frequency; and
requantisation logic operable to requantise said at least 3-level quantized signal to a 2-level quantized signal to be provided as said band pass signal.

8. A method of generating a band pass signal, said method comprising:
receiving an input signal and performing at least a 3-level quantisation of said input signal to generate an at least 3-level quantised signal; and
requantising said at least 3-level quantised signal to a 2-level quantised signal to be provided as said band pass signal, said requantisinq comprises requantising said at least 3-level quantised signal when at said at least one intermediate level to said lower level to generate said 2-level quantized signal.

9. The method of claim 8, wherein requantising comprises requantising said at least 3-level quantized signal when at said intermediate level to said lower level to generate said 2-level quantised signal.

10. A method of generating a band pass signal, said method comprising:
receiving an input signal and performing at least a 3-level quantisation of said input signal to generate an at least 3-level quantised signal, wherein receiving an input signal and performing comprises quantising said input signal to one of a lower level, at least one intermediate level and an upper level, and said requantising comprises requantising said at least 3-level quantised signal when at said at least one intermediate level to one of said lower level and said upper level; and
requantisinq said at least 3-level quantised signal to a 2-level quantised signal to be provided as said band pass signal.

11. A method of generating a band pass signal, said method comprising:
receiving an input signal and performing at least a 3-level quantisation of said input signal to generate an at least 3-level quantised signal, wherein requantisinq said at least 3-level quantised signal comprises a 3-level quantised signal and said quantising comprises quantising said input signal to one of said lower level, an intermediate level and said upper level, and said requantising comprises requantising said at least 3-level quantised signal when at said intermediate level to one of said lower level and said upper level; and requantising said at least 3-level quantised signal to a 2-level quantised signal to be provided as said band pass signal.

12. A method of generating a band pass signal, said method comprising:

receiving an input signal and performing at least a 3-level quantisation of said input signal to generate an at least 3-level quantised signal; and requantising said at least 3-level quantised signal to a 2-level quantised signal to be provided as said band pass signal, wherein requantising comprises applying a dc offset equivalent to a difference between one of said lower level and said intermediate level and said upper level and said intermediate level to generate said 2-level quantised signal.

13. A method of generating a band pass signal, said method comprising:

receiving an input signal and performing at least a 3-level quantisation of said input signal to generate an at least 3-level quantised signal, wherein receiving an input signal and performing comprises quantising said input signal at a sampling frequency; and said method comprises modulating said at least 3-level quantised signal with a carrier signal having a carrier frequency, said carrier frequency being an integer multiple of said sampling frequency; and requantisinq said at least 3-level quantised signal to a 2-level quantised signal to be provided as said band pass signal.

* * * * *